US00H002146H

(19) United States

(12) Statutory Invention Registration

Burnfield et al.

(10) Reg. No.: US H2146 H

(43) Published: Mar. 7, 2006

(54) METHOD FOR DETERMINING LONG TERM STABILITY

(75) Inventors: Robert N. Burnfield, Lewiston, NY (US); Larry E. Meister, Grand Island, NY (US); David R. Stubbs, Ransomville, NY (US)

(73) Assignee: United States of America, Washington, DC (US)

(21) Appl. No.: 09/572,415

(22) Filed: May 12, 2000

(51) Int. Cl.
*H04B 17/00* (2006.01)

(52) U.S. Cl. ..... 367/13

(58) Field of Classification Search ..... None
See application file for complete search history.

*Primary Examiner*—Daniel Pihulic
(74) *Attorney, Agent, or Firm*—John P. Tarlano; Darrell E. Hollis

(57) ABSTRACT

A method of determining long term power variation, as an indication of long term stability of power output, by steps of measuring power output at successive intervals of time, determining variations in power output, from an average power output, at corresponding intervals of time, making a Fourier transform of each variation in power output, calculating a power spectral density from each Fourier transform, plotting a log of each power spectral density, extrapolating the plot to find a value, designated as a log of a power spectral density, from the plot, calculating a power spectral density from the found value of the log of the power spectral density, and making an inverse Fourier transform of the calculated power spectral density, to determine the long term power variation.

1 Claim, 2 Drawing Sheets

A statutory invention registration is not a patent. It has the defensive attributes of a patent but does not have the enforceable attributes of a patent. No article or advertisement or the like may use the term patent, or any term suggestive of a patent, when referring to a statutory invention registration. For more specific information on the rights associated with a statutory invention registration see 35 U.S.C. 157.

METHOD FOR DETERMINING LONG TERM STABILITY

FIELD OF THE INVENTION

The present invention relates to a method of determining an indication of long term stability of power output from a device such as a gravity meter.

BACKGROUND OF THE INVENTION

In the past, power output from a device such as a gravity meter had to be measured over a long term $T_A$, in order to determine long term stability of the power output from the device. Variations, Delta $P_{T2}$, Delta $P_{T3}$ . . . Delta $P_{TA}$ from a null power output value, P, of the device would be measured over the term $T_A$. This period of time $T_A$ would be needed to determine a long term variation Delta $P_{TA}$ from the null power output value P. $T_A$ is an empirically determined drift cycle time for power output variations of such devices.

The present method allows one to determine Delta $P_{TA}$, as an indication of long term stability of power output, without having to take measurements of power output over a long term $T_A$. The present method allows one to determine long term stability of power output of the device, even though measurements are not taken over a period of a drift cycle time, $T_A$.

In the present method, measurements of the power output values $P_{T2}$, $P_{T3}$ etc. of the gravity meter are made at intervals of time $T_2$, $T_3$, $T_4$ etc, until a length of time $T_1$ is reached. Here $T_3$ equals twice $T_2$. $T_4$ equals three times $T_2$. A power output plot versus time, is formed from the set of power output values.

A center line is drawn through the power output plot. This center line represents the constant power output,P, of the gravity meter. A set of power output variation values, Delta $P_{T2}$, Delta $P_{T3}$ . . . Delta $P_{T1}$ from value P is calculated. The vavalues in this set is correspond to the regular intervals of time from $T_2$ to $T_1$.

A Fourier transform of each power output variation, Delta $P_{T2}$, Delta $P_{T3}$, . . . Delta $P_{T1}$, is made. A power spectral density value PSD is calculated. PSD is the value of the Fourier transform at a particula frequency $f_T$, where $f_T$ equals 1/T. For example, a power spectral density value, $(PSD)_{T2}$, is the value of the Fourier transform of Delta $P_{T2}$, at the frequency $f_2=1/T_2$. A power spectral density value $(PSD)_{T3}$ is the value of the Fourier transform of Delta $P_{T3}$ at the frequency $f_3=1/T_3$. A power spectral density value $(PSD)_{T1}$ is the value of the Fourier transform of Delta $P_{T1}$ at the frequency $f_1=1/T_1$.

The log of each calculated power spectral density value is ploted against the log of a frequency associated with the length of time required to find a power output variation associate with each calculated power spectral density value. The plotting is done on log-log paper. This log-log paper is an example of a log-log form.

The power spectral density log plot can be extrapolated, in order to find a log of a power spectral density value $(PSD)_{TA}$ a a value that is the log of a frequency $f_A=1/T_A$. The value of $(PSD)_{TA}$ and $f_A$ are found from the log values of $(PSD)_{TA}$ and $f_A$.

The inverse Fourier transform of the power spectral density value $(PSD)_{TA}$ is taken in order to find the variation, Delta $P_{TA}$.

One can determine a line of slope of the power spectral density plot, and can therefore extrapolate the line of slop.

plot. This determination of a lione of slope is performed by examining the power spectral densty plot generated from data taken over a length of time $T_1$, that is at intervals $T_2$, $T_3$, $T_4$ . . . $T_1$.

One does not have to measure a power variation, Delta $P_{TA}$, in the power output of a gravity meter at a time $T_A$, in order to determine the power output drift, or variation, for this time $T_A$. One can merely measure the slope of the power spectral density curve in order to predict the value of the power spectral density at a time, $T_A$, and take the inverse Fourier transform of that value.

Further one can find noise power, $P_{TATB}$, in a bandwith between $f_A$ and $f_B$, where $f_B$ is smaller than $f_2$. One first integrates a power density function, S(f), that gives the ploted power spectral density, $(PSD)_T$, between $f_1$ and $f_2$, to find a noise power $P_{T1T2}$. Then one uses the value $P_{T1T2}$ in an algorithm to find $P_{TATB}$.

SUMMARY OF THE INVENTION

A method of determining power variation Delta $P_{TA}$ as an indication of long term stability of power output comprising determining power output at successive intervals of time T beginning at a first interval of time $T_2$ and continuing to an interval of time $T_1$, where time $T_1$ is shorter than an interval of time $T_A$, determining variations, Delta $P_{T2}$ to Delta $P_{T1}$, in power output, from an average power output P, at corresponding intervals of time from $T_2$ to $T_1$, making a Fourier transform of each variation in power output, calculating a power spectral density, from $(PSD)_{T2}$ to $(PSD)_{T1}$, from each Fourier transform, at a frequency f, where f equals 1 over an interval of time T associated with each Fourier transform, plotting a log of each power spectral density, from $(PSD)_{T2}$ to $(PSD)_{T1}$ at a log of the associated frequency f, on a log-log plot form, extrapolating value designated as a a log of a power spectral density, $(PSD)_{TA}$, at a log of a frequency $f_A$, where $f_A$ equals $1/T_A$, from the plot form, calculating the power spectral density $(PSD)_{TA}$ from the log of the power spectral density $(PSA)_{TA}$, making an inverse Fourier transform of the power spectral density $(PSD)_{TA}$ to determine power variation Delta $P_{TA}$.

DESCRIPTION OF THE PREFERRED EMBODIMENT

Figure 1:
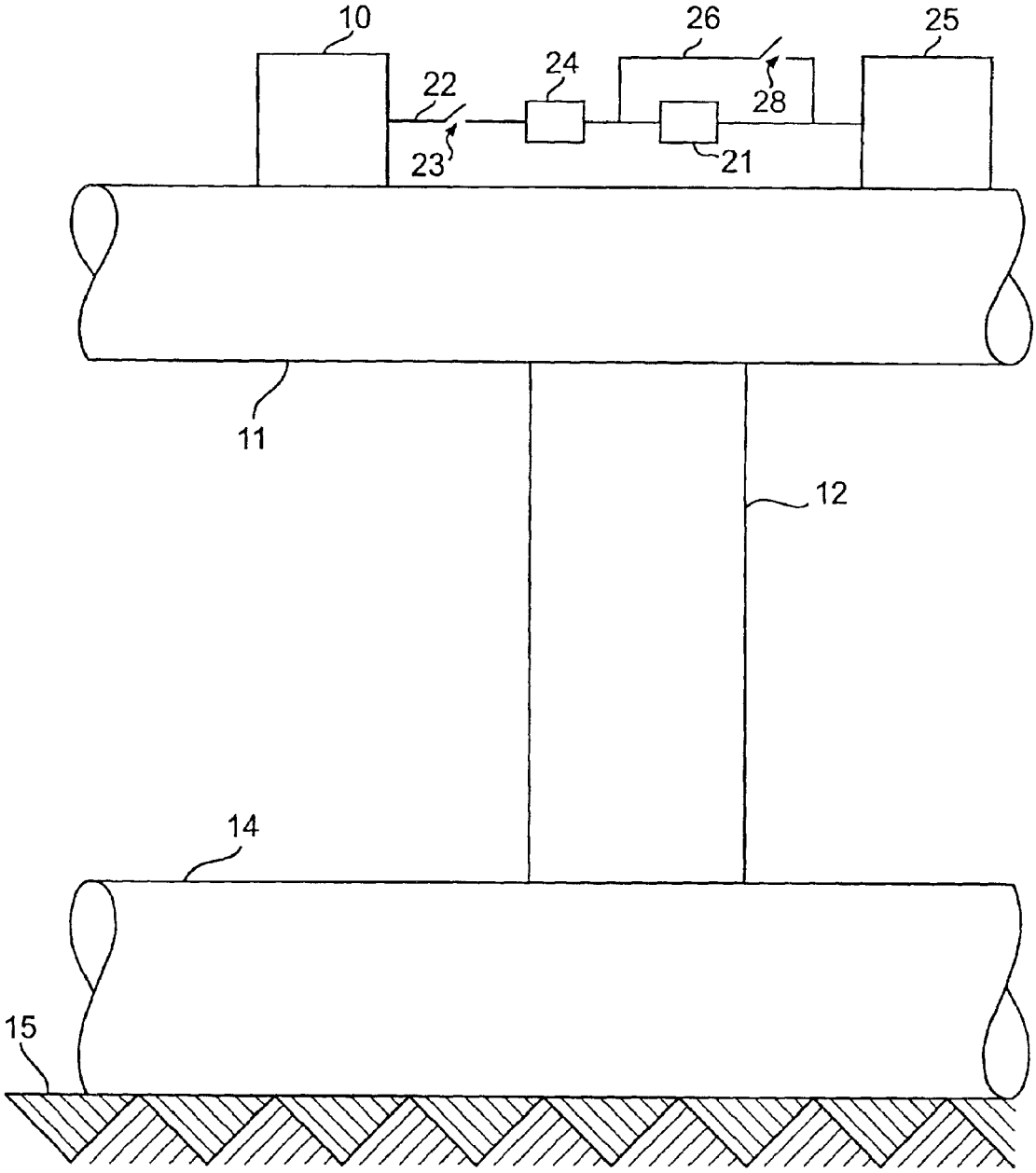
FIG. 1 is a plan diagram of a test setup to determine power output of a gravity meter.

In FIG. 1, a gravity meter 10 is located on a table 11. The table 11 is rigidly attached to a pedestal 12. The pedestal 12 is anchored to a concrete floor 14. The concrete floor 14 extends for 50 feet horizontally over the earth 15 in all directions from the gravity meter 10. The concrete floor 14 is solidly joined to the earth 15.

The gravity meter 10 is electrically connected to a capacitor 21 be means of an electrical cable 22, the connection being through a switch 23 and also through a full wave rectifier 24. The gravity meter 10 is shown as energized. Power output of the gravity meter 10 is nulled to a nominal zero voltage output while gravity meter 10 is measuring acceleration due to local gravity. The power out of the gravity meter 10 has a nominally nulled zero voltage value due to a constant force of gravity of 1 g.

Noise energy $E_2$, due to drift in the gavity meter 10, is collected by the capacitor 21 for one hour and produces a voltage $V_2$ in capacitor 21. The noise energy $E_2$, due to drift, is accumulated in capacitor 21 over an interval $T_2$ of one hour. That is, the energy, generated due to unstable circuit elements within the gravity meter 10, for a period $T_2$ of one hour, is gathered in an energy accumulator, such as capacitor 21.

A volt meter 25 is connected through an electrical cable 26 and a switch 28. Switch 23 is opened and switch 28 is closed. The voltage reading $V_2$ of the capacitor 21 is taken after one hour by volt meter 25. The associated frequency for this reading is $f_2$. $f_2$ equals $1/T_2$.

Switch 28 is then opened and switch 23 is closed.

The voltage reading $V_3$ of the capacitor 21 is repeated after a second hour. The associated energy-gathering period $T_3$ for this latter voltage reading, $V_3$, is two hours. $T_3$ equals twice $T_2$. The associated frequency for the latter reading is $f_3$. $f_3$ equals $1/T_3$. The energy collected after two hours is $E_3$.

Reading of voltages, $V_2$, $V_3$ . . . etc. of capacitor 21 are taken at periodic intervals $T_2$, $T_3$ . . . etc. The associated frequencies for the readings are $f_2=1/T_2$, $f_3=1/T_3$ . . . etc. The associated noise energies are $E_2$, $E_3$ . . . etc.

Twenty four voltage readings of capacitor 21 are taken, at one hour intervals. The twenty four voltage readings are thus obtained over a length of time of 24 hours, a time designated as $T_1$.

Again, an accumulation of drift energy is continued in capacitor 21 for twenty four intervals, each period being greater than the previous interval by a time $T_2$. The first interval, $T_2$, is one hour long. The twenty-fourth interval, $T_1$, is twenty four hours long. The twenty fourth accumulation of energy is the total noise energy $E_1$ that is generated by the gravity meter 10 over a twenty-four hour period $T_1$. The noise energy $E_1$, due to drift over a 24 hour period $T_1$, is thus determined.

A power value $P_{T2}$, where $P_{T2}=E_2/T_2$, is determined. A power value $P_{T3}$, where $P_{T3}=E_3/T_3$, is also determined. This determination is repeated until a power value $P_{T1}$, where $P_{T1}=E_1/T_1$, is determined.

The noise power values $P_{T2}$, $P_{T3}$ . . . $P_{T1}$ are plotted and a straight line drawn through the plot. This straight line represents the average noise power out of the gravity meter 10 over the twenty four one hour lengths of time.

Twenty four power variations, Delta $P_{T2}$, Delta $P_{T3}$ . . . Delta $P_{T1}$, from the straight line, are obtained.

The power variations, Delta P, are determined after reading voltage levels, $V_2$, $V_3$, $V_4$, . . . $V_1$ of the capacitor 21. Since $E=CV_2$, where C is the capacitance of capacitor 21, the energy values E can be determined. Then twenty four noise power values $P_{T2}$, $P_{T3}$, $P_{T4}$ . . . $P_{T1}$ are determined using the energy values $E_2$, $E_3$, $E_4$ . . . $E_1$ that are determined for the twenty four periods of time $T_2$, $T_3$, $T_4$ . . . $T_1$ during which energy, collected by capacitor 21, is measured. A frequency $f_2$, equal to $1/T_2$, is calculated. $f_2$ is associated with a power variation Delta $P_{T2}$. A frequency $f_3$, equal to $1/T_3$, is also calculated. $f_3$ is associated with power variation Delta $P_{T3}$. This is repeated until a frequency $f_1$, equal to $1/T_1$, is calculated. $f_1$ is associated with power variation Delta $P_{T1}$.

Each of these power variations, Delta P, is operated on by a Fourier transform process. A Fourier transform, FT, for each power variation, Delta P, is found.

A power spectral density value (PSD) for each power variation is found. A power spectral density value (PSD) is the value of a Fourier transform FT of a power variation Delta P, at as associated frequency f. For instance, a power spectral density value $(PSD)_{T2}$ is found from Fourier transform, FT, of Delta $P_{T2}$ at $f_2$.

Power spectral density values $(PSD)_{T2}$, $(PSD)_{T3}$ . . . $(PSD)_{T1}$ are the values of the twenty four Fourier transforms of the power variation values Delta $P_{T2}$, Delta $P_{T3}$ . . . Delta $P_{T1}$ at the frequencies $f_2$, $f_3$ . . . $f_1$. A book on how to take a Fourier transform of a value, is entitled "Signal Analysis And Estimation" by Ronald L. Frante, John Wiley & Sons (1988). This book is incorporated herein by reference.

Figure 2:
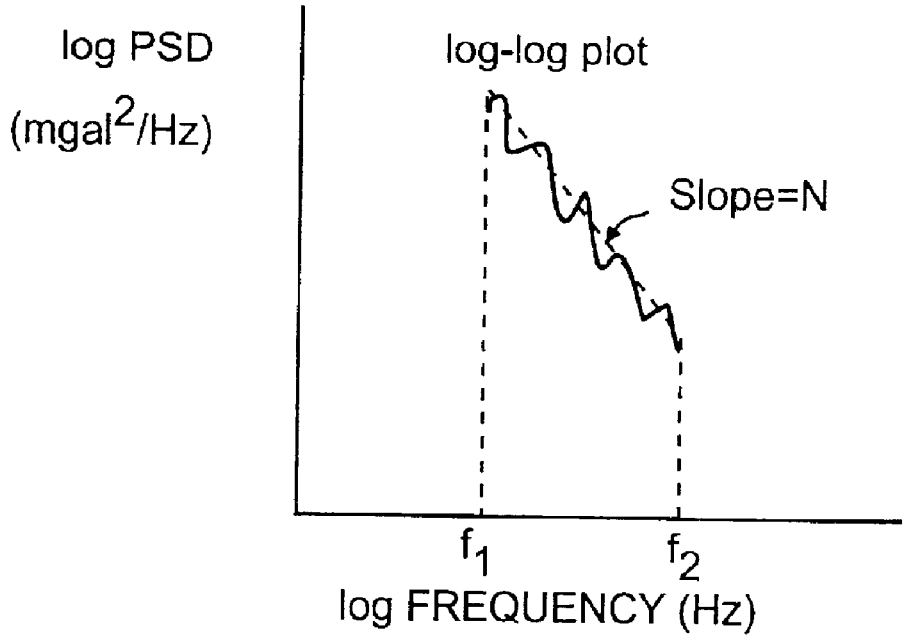
FIG. 2 is a power spectral density curve, using power output variation measurements over a length of time $T_1$.

As shown in FIG. 2, a log of a power spectral density value (PSD) associated with each of the twenty four frequencies $f_2$, $f_3$ . . . $f_1$ is plotted on a log-log plot. The value of the log of a power spectral density value (PSD) is plotted at the value of the log of the frequency f used in finding (PSD).

An algorithm is generated. The algorithm describes a line through the points of the log-log plot, as shown in FIG. 2. The algorithm is used to evaluate the stability of the gravity meter 10. The algorithm is:

$$\log(PSD)=\log(k)+N\log(f),$$

where (PSD) is power spectral density associated with an energy E collected over an interval of time T, and f equals 1/T. N is the slope of the straight line, shown in FIG. 2, drawn through the log-log plot. N is a negative number.

Thus, $$\log(PSD)_{T1}=\log(k)+N\log(f_1).$$

Also, $$\log(PSD)_{T2}=\log(k)+N\log(f_2).$$

Figure 3:
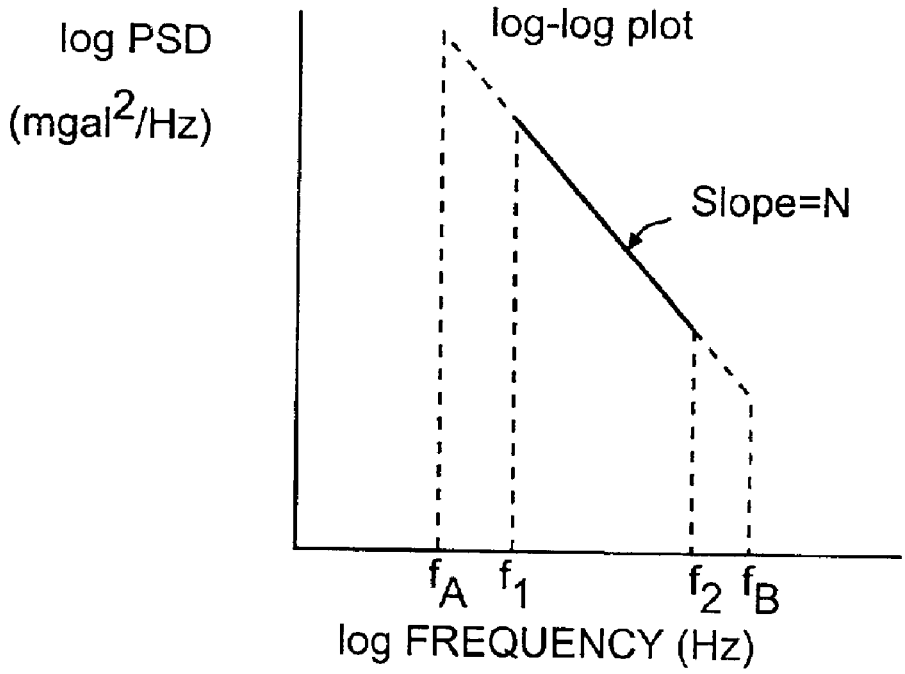
FIG. 3 is an extrapolated power spectral density curve that predicts power spectral density at a long period of time $T_A$, where $T_A$ is an empirically determined drift cycle time in power output of a gravity meter.

By extrapolation of the line of FIG. 2, the point $\log(PSD)_{TA}=\log(k)+N\log(f_A)$, is reached, as shown in FIG. 3.

Also, $\log(PSD)=\log(k)-N\log(T)$, where (PSD) is power spectral density associated with an energy E collected over an interval of time T, and T equals 1/f.

Thus, $$\log(PSD)_{T1}=\log(k)-N\log(T_1).$$

Also, $$\log(PSD)_{T2}=\log(k)-N\log(T_2).$$

To find the value of N, $\log(PSD)_{T2}$ is subtracted from $\log(PSD)_{T1}$. Then $\log(PSD)_{T1}-\log(PSD)_{T2}=N\log(T_2)-N\log(T_1)$. $N=[(\log(PSD)_{T1}-\log(PSD)_{T2})/(\log(T_2)-\log(T_1))]$.

To find the value of log (k), the found value for N is substituted into $\log(PSD)_{T1}=\log(k)-N\log(T_1)$. Thus, $$\log(k)=\log(PSD)_{T1}=[(\log(PSD)_{T1}-\log(PSD)_{T2})/(\log(T_2)-\log(T_1))](\log T_1).$$

I. Determination of $P_{TA}$

Substituting the values for N and log (k) into $\log(PSD)_{TA}=\log(k)-N\log(T_A)$, the value for $\log(PSD)_{TA}$ is $\log(PSD)_{TA}=\log(PSD)_{T1}+[(\log(PSD)_{T1}-\log(PSD)_{T2})/(\log(T_2)-\log(T_1))](\log T_1)-[(\log(PSD)_{T1}-\log(PSD)_{T2})/(\log$ $(T_2)-\log(T_1))](\log T_A)$. The log of the power spectral density $(PSA)_{TA}$, $\log(PSD)_{TA}$, due to an amount of drift after a thirty day time $T_A$, is thusly determined.

The power spectral density $(PSA)_{TA}$, for a time $T_A$, is found by taking the inverse log of log $(PSD)_{TA}$. Delta $P_{TA}$ is found by taking the inverse Fourier transform of $(PSA)_{TA}$.

From the power spectral density $(PSA)_{TA}$, one can find the variation, Delta $P_{TA}$, that is, the output noise power variation from the average output noise power P, of the gravity meter 10, after a relatively long time $T_A$. Again, delta $P_{TA}$ is found by taking the inverse Fourier transform of the power spectral density $(PSD)_{TA}$.

Further $$(PSD)_{T2}=kf_2^N=k(1/T_2)^N=k(T_2^{-1})^N=kT_2^{-N}.$$

$$(PSD)_{T1}=kf_1^N=K(1/T_1)^N=k(T_1^{-1})^N=kT_1^{-N}.$$

N is the slope of the straight line drawn through the log-log plot of FIG. 2. Again N is a negative number.

The capacitor 21 collects energy when the drift of gravity meter 10 is positive. Capacitor 21 also collects energy when the drift of gravity meter 10 is negative. The capacitor 21 should be a very low noise capacitor. The values of noise energy for 24 intervals are measured. The power spectral densities are determined by taking the Fourier transforms of variations from an average power, for the 24 measured energies involved.

It is found that an algorithm, such that log of the power spectral density (PSD) equals the log of k, where k is a constant, minus N times the log of the frequency for the particular power spectral density, defines the line shown in the log-log plot of FIG. 2. N is the slope of the straight line fitted to the log-log plot of FIG. 2.

II. Determination of $P_{TATB}$

The above found value of N is used in another algorithm to find the noise power, $P_{TATB}$, in the bandwith between frequencies $f_A$ and $f_B$. $P_{TATB=PT1T2}[(f_B^{N+1}-f_A^{N+1})/(f_2^{N+1}-f_1^{N+1})]$. $P_{T1T2}$ is found by first integrating a power spectral function S(f) from the log of the frequency $f_1$ to the log of the frequency $f_2$. S(f) is a mathematical expression generated to mathematically express the plot of the log of the power spectral density of FIG. 2. $P_{T1T2}$ is the noise power in the bandwith between frequencies $f_1$ and $f_2$. One can thus determine the noise power, $P_{TATB}$, in the bandwith between frequencies $f_A$ and $f_B$.

$f_1$=/(24 hours) where T1 is 24 hours. $f_2$=1/(1 hour) where $T_2$ is 1 hour. $f_A$ is 1/(720 hours) where $T_A$ is 720 hours. $f_B$ could be a lower frequency, such as $f_B$=1/(½ hour). $T_B$ is a period of ½ hour.

In the above example:

$f_1=1/T_1$ $T_1$=24 hours $f_2=1/T_2$ $T_2$=1 hour $f_A=1/T_A$ $T_A$=720 hours $f_B=1/T_B$ $T_B$=½ hour While the present invention has been disclosed in connection with the preferred embodiment thereof, it should be understood that there may be other embodiments which fall within the spirit and scope of the invention as defined by the following claims.

What is claimed is:

1. A method of determining power variation Delta $P_{TA}$ as an indication of long term stability of power output, comprising:

(a) determing power output at successive intervals of time T beginning at a first interval of time $T_2$ and continuing to an interval of time $T_1$, where time $T_1$ is shorter than an interval of time $T_A$;

(b) determining variations, Delta $P_{T2}$ to Delta $P_{T1}$, in power output, from an average power output P, at corresponding intervals of time $T_2$ to $T_1$;

(c) making a Fourier transform of each variation in power output;

(d) calculating a power spectral density, from $(PSD)_{T2}$ to $(PSD)_{T1}$, from each Fourier transform, at a frequency $f_T$, where T is the interval of time associated with each Fourier transform;

(e) plotting of a log of each power spectral density $(PSD)_{T2}$ to $(PSD)_{T1}$ at a log of the associated frequency f, on a log-log plot form;

(f) extrapolating a value designated as a log of a power spectral density $(PSD)_{TA}$, at a log of frequency $f_A$, where $f_A$ equals $1/T_A$, from the plot form;

(g) calculating the power spectral density $(PSD)_{TA}$ from the log of the power spectral density $(PSD)_{TA}$;

(h) making an inverse Fourier transform of the power spectral density $(PSD)_{TA}$ to determine power variation Delta $P_{TA}$.

* * * * *